United States Patent
Doan et al.

(10) Patent No.: US 11,545,474 B2
(45) Date of Patent: Jan. 3, 2023

(54) METHOD AND SYSTEM FOR TRANSFERRING ALIGNMENT MARKS BETWEEN SUBSTRATE SYSTEMS

(71) Applicants: SemiLEDs Corporation, Chu-Nan (TW); Shin-Etsu Chemical Co. Ltd., Tokyo (JP)

(72) Inventors: David Trung Doan, Hsinchu County (TW); Yoshinori Ogawa, Kanagawa (JP); Nobuaki Matsumoto, Gunma (JP)

(73) Assignees: SemiLEDs Corporation, Chu-Nan (TW); Shin-Etsu Chemical Co., Ltd., Tokyo (JP)

( * ) Notice: Subject to any disclaimer, the term of this patent is extended or adjusted under 35 U.S.C. 154(b) by 79 days.

(21) Appl. No.: 17/241,324

(22) Filed: Apr. 27, 2021

(65) Prior Publication Data

US 2021/0351166 A1   Nov. 11, 2021

Related U.S. Application Data

(60) Provisional application No. 63/022,579, filed on May 11, 2020.

(51) Int. Cl.
*H01L 25/075* (2006.01)
*H01L 33/00* (2010.01)
*H01L 21/68* (2006.01)

(52) U.S. Cl.
CPC .......... *H01L 25/0753* (2013.01); *H01L 21/68* (2013.01); *H01L 33/0093* (2020.05)

(58) Field of Classification Search
CPC .............................................. H01L 2223/5116
See application file for complete search history.

(56) References Cited

U.S. PATENT DOCUMENTS 4,418,467 A   12/1983   Iwai
6,627,477 B1   9/2003   Hakey et al.
(Continued)

FOREIGN PATENT DOCUMENTS

CN   111987034 A   11/2020

OTHER PUBLICATIONS

International Application No. PCT/US2021/030396, filing date May 3, 2021, SemiLEDs Corporation et al., International Search Report and Written Opinion of the International Searching Authority, dated Aug. 18, 2021, pp. 1-11.
(Continued)

*Primary Examiner* — Robert K Carpenter
(74) *Attorney, Agent, or Firm* — Stephen A. Gratton

(57) ABSTRACT

A method for transferring alignment marks between substrate systems includes providing a substrate having semiconductor devices and alignment marks in precise alignment with the semiconductor devices; and physically transferring and bonding the semiconductor devices and the alignment marks to a temporary substrate of a first substrate system. The method can also include physically transferring and bonding the semiconductor devices and the alignment marks to a mass transfer substrate of a second substrate system; and physically transferring and bonding the semiconductor devices and the alignment marks to a circuitry substrate of a third substrate system. A system for transferring alignment marks between substrate systems includes the substrate having the semiconductor devices and the alignment marks in precise alignment with the semiconductor devices. The system also includes the first substrate system, and can include the second substrate system and the third substrate system.

13 Claims, 11 Drawing Sheets

(56) References Cited

U.S. PATENT DOCUMENTS

| | | | |
|---|---|---|---|
| 6,686,222 | B2 | 2/2004 | Omizo et al. |
| 8,102,064 | B2 | 1/2012 | Renn |
| 8,153,499 | B2 | 4/2012 | Or-Bach et al. |
| 10,192,832 | B2 | 1/2019 | Hsiao et al. |
| 2006/0220265 | A1 | 10/2006 | Noda et al. |
| 2013/0075938 | A1 | 3/2013 | Yang et al. |
| 2020/0185333 | A1* | 6/2020 | Higashisaka ....... H01L 33/0093 |

OTHER PUBLICATIONS

Gruber M, Hagedorn D, Eckert W, Precise and simple optical alignment method for double-sided lithography. Appl Opt. vol. 40, No. 28, Oct. 1, 2001, pp. 1-4.

* cited by examiner

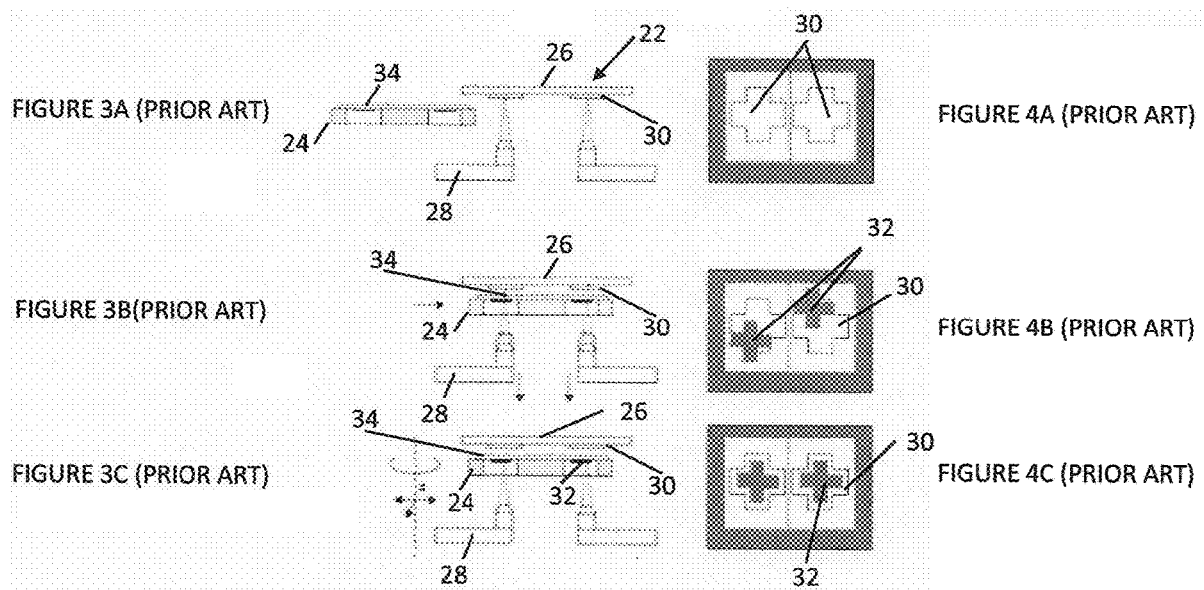

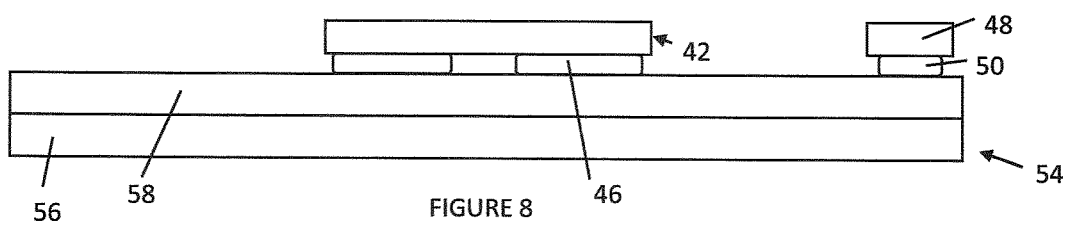
FIGURE 8
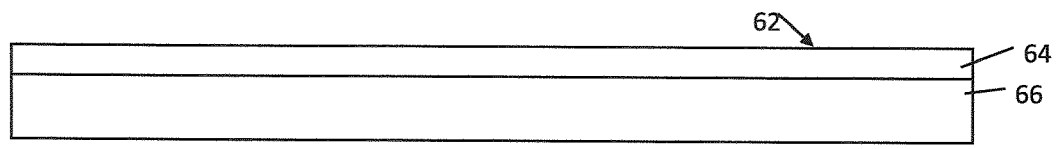
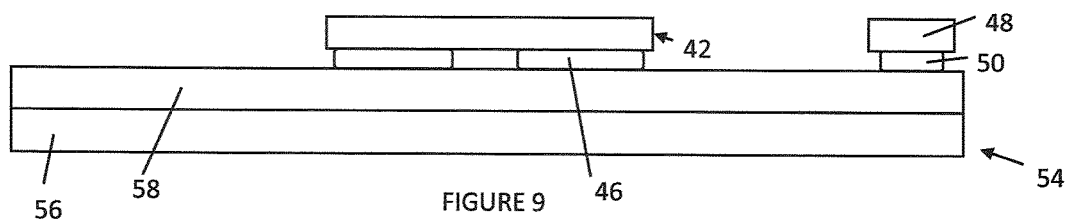
FIGURE 9

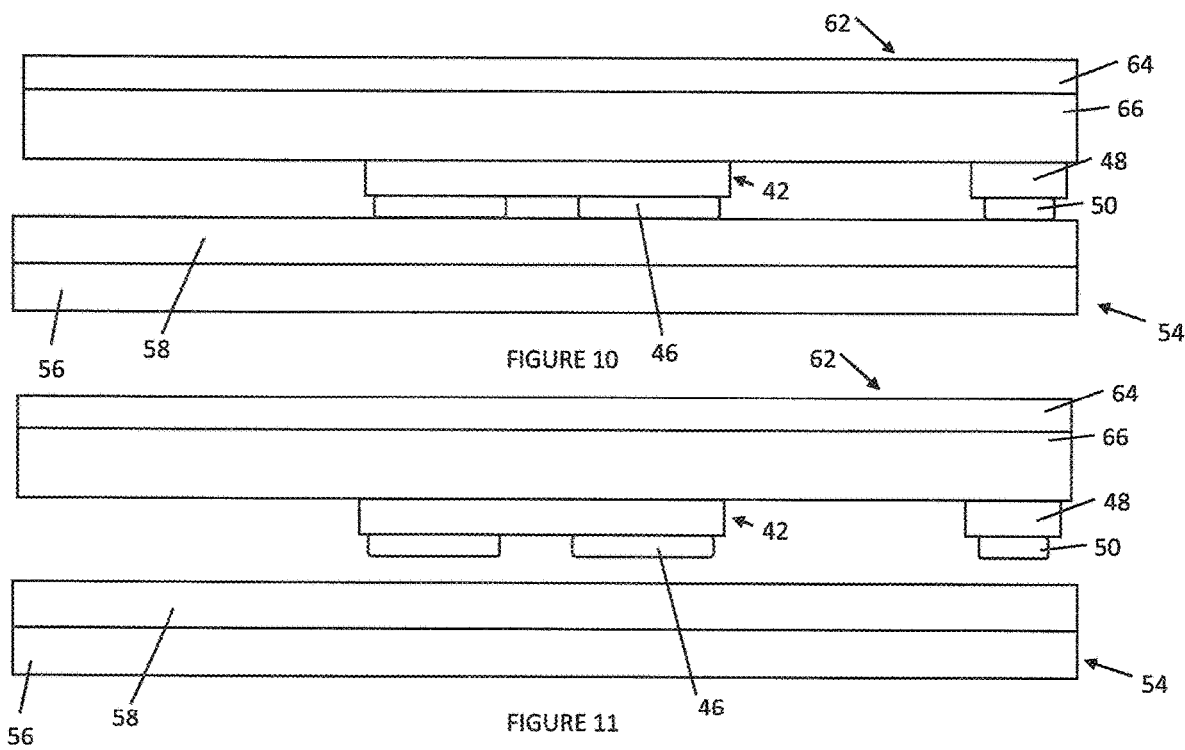

METHOD AND SYSTEM FOR TRANSFERRING ALIGNMENT MARKS BETWEEN SUBSTRATE SYSTEMS

CROSS REFERENCE TO RELATED APPLICATION

This application claims priority from U.S. Provisional No. 63/022,579, filed May 11, 2020 which is incorporated herein by reference.

FIELD

This disclosure relates to the fabrication of semiconductor devices and particularly to methods and systems that utilize alignment marks during fabrication of semiconductor devices on substrates.

BACKGROUND

In the semiconductor fabrication art there are techniques for using alignment marks during semiconductor fabrication processes. These fabrication processes include electrical measurements, substrate inspection and die positioning. In general, alignment marks are used in process steps that require precision alignment, such as photolithography and die placement.

Typically alignment marks on formed on substrates using photolithography. FIG. 1 illustrates an exemplary prior art system 8 for forming alignment marks 20a, 20b on the side of a substrate 10. As shown in FIG. 1, the system 8 includes the substrate 10, a wafer chuck 12 and an X-Y stage 18. Alignment marks 14a, 14b in microscopes 16a, 16b are used to form the alignment marks 20a, 20b on the substrate 10 using photolithography.

FIGS. 2A-2D schematically illustrate exemplary prior art alignment marks. FIG. 2A shows alignment marks configured as features 11S on a substrate 10. FIG. 2B shows alignment marks configured as features 11M on a mask 13. FIG. 2C shows the mask 13 over the substrate 10 with the features 11S on the substrate 10 aligned with features 11M on the mask 13. FIG. 2D shows alignment marks printed on the substrate 10 that become printed features 11P.

FIGS. 3A-3C and FIGS. 4A-4C illustrate a prior art mask alignment system 22 that includes a wafer chuck 24 for holding a substrate 34, an alignment mask 26, and a BSA split field microscope 28. As shown in FIGS. 3A and 4A, the system 22 can be configured for the focusing and storage of mask alignment marks 30. As shown in FIGS. 3B and 4B, the system 22 can be configured for focusing of substrate alignment marks 32. As shown in FIGS. 3C and 4C the system has achieved alignment between the mask alignment marks 30 and the substrate alignment marks 32.

Another alignment method uses electrical connections to the alignment marks. However, this method does not work on super hard substrates, difficult to etch substrates, or chemically sensitive substrates, such as sapphire, aluminum nitride, and gallium arsenide.

Typically, if two different substrates need alignment, the alignment mark is placed in a location which is only proximate to but not exactly on the point where alignment is necessary. This technique greatly reduces the ability to make precise alignment for future processing steps. For example, when a mark needs to be transferred between substrates, the substrates are stacked, and photolithography is performed with one or both substrates being transparent. Alignment marks using cameras on both sides of the substrates to align the back plates can also be used, but require an expensive stepping tool. In addition, this technique requires a high level of skill, precision tools, and is very costly.

Another prior art technique to transfer devices from one substrate to another fabricates an alignment key via deposition or etching on the substrate that carries the devices. In this case, the second substrate can include an alignment mark of its own or no alignment mark at all. However, when an alignment key is used on different substrates, such as stacked wafers, or devices having multiple layers, problems can arise. For example, the fabrication of mass transfer devices for use in 3D integrated systems and circuits often requires work to be done on many different substrates and many different locations. Precision alignment and location placement must be performed as tolerances decrease. This can be difficult to accomplish with photolithography alone. As die sizes reach sub 150 μm levels, the precision and accuracy required through the entire frontend, backend, and packaging (or mass transfer) of the semiconductor devices becomes more difficult to accomplish.

This disclosure is directed to a method and system for transferring alignment marks between substrate systems that can be used throughout the fabrication process including at the backend and packaging of the semiconductor devices without the need to recalibrate each time the substrate is transferred to a different substrate system.

SUMMARY

A method for transferring alignment marks between substrate systems includes the step of providing a substrate comprising a plurality of semiconductor devices and a plurality of alignment marks in precise alignment with the semiconductor devices. The alignment marks comprise physical structures formed using semiconductor fabrication techniques that can be physically transferred between substrate systems. In an illustrative embodiment, the substrate comprises a semiconductor substrate having epitaxial structures that form the semiconductor devices and the alignment marks. The alignment marks can comprise portions of an epitaxial structure, a deposited material, or a combination thereof formed on the substrate using semiconductor fabrication techniques. Rather than a semiconductor substrate, the substrate can comprise a carrier substrate configured for holding the semiconductor devices.

The method also includes the step of providing a first substrate system comprising a temporary substrate having an adhesive layer thereon. The method also includes the step of physically transferring and bonding the semiconductor devices and the alignment marks to the temporary substrate of the first substrate system.

The method also includes the step of separating the substrate from the first substrate system leaving the semiconductor devices and the alignment marks on the temporary substrate while maintaining the precise alignment between the semiconductor devices and the alignment marks. The method can also include the step of physically transferring and bonding the semiconductor devices and the alignment marks to a second substrate system while maintaining the precise alignment between the semiconductor devices and the alignment marks. In an illustrative embodiment the second substrate system includes a mass transfer substrate having an adhesive layer.

The method can further include the step of providing a third substrate system comprising a circuitry substrate having a plurality of circuits and a plurality of circuitry alignment marks on either side of the circuitry substrate in alignment with the circuits. The method can further include the steps of placing the mass transfer substrate of the second substrate system in physical contact with the circuitry substrate of the third substrate system, physically transferring and bonding the alignment marks to the circuitry substrate, and separating the mass transfer substrate leaving the circuitry substrate, the semiconductor devices and the alignment marks on one side while maintaining the precise alignment between the semiconductor devices and the alignment marks.

The method can further include the step of further processing the semiconductor devices on the third substrate system using semiconductor fabrication processes, such as etching and depositing of conductors. During these fabrication processes, the transferred alignment marks and the circuitry alignment marks on the circuitry substrate maintain the precise alignment with the semiconductor devices.

A system for transferring alignment marks between substrate systems includes a substrate comprising a plurality of semiconductor devices and a plurality of alignment marks in precise alignment with the semiconductor devices. The alignment marks comprise physical structures that can be physically transferred between substrate systems. The system also includes a first substrate system comprising a temporary substrate having an adhesive layer thereon. The temporary substrate is configured to support and bond with the semiconductor devices and the alignment marks while maintaining the precise alignment between the semiconductor devices and the alignment marks. The system can also include a second substrate system comprising a mass transfer substrate having an adhesive layer thereon. The mass transfer substrate is configured to support and bond with the semiconductor devices and the alignment marks while maintaining the precise alignment between the semiconductor devices and the alignment marks. The system can also include a third substrate system comprising a circuitry substrate having a plurality of circuits and a plurality of circuitry alignment marks in alignment with the circuits.

BRIEF DESCRIPTION OF THE DRAWINGS

FIGS. 3A-3C are schematic views illustrating a prior art mask alignment system in operation;

FIGS. 4A-4C are schematic cross sectional views illustrating mask alignment marks and substrate alignment marks during operation of the prior art mask alignment system;

FIG. 8 is a schematic cross sectional view of a step in the method of separating the substrate leaving the semiconductor devices and the alignment marks on the temporary substrate of the first substrate system;

FIGS. 9-12 are schematic cross sectional views of further steps in the method wherein the semiconductor devices and the alignment marks are transferred from the temporary substrate to a second substrate system having a mass transfer substrate;

DETAILED DESCRIPTION

Figure 1:
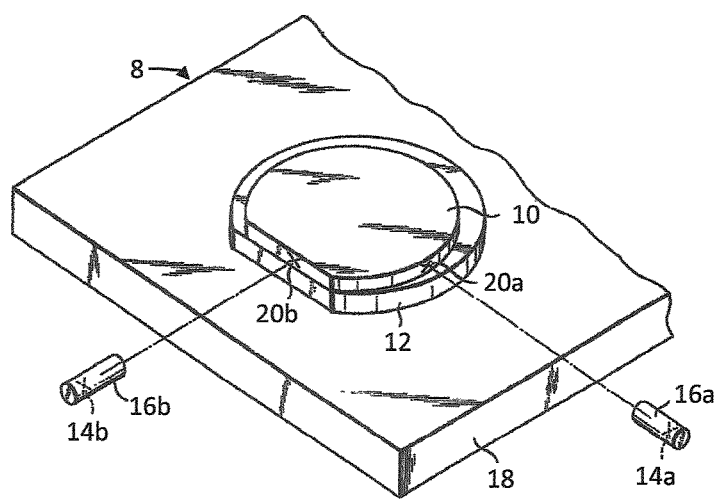
FIG. 1 is a schematic perspective view of a prior art alignment system.
Figure 2A:
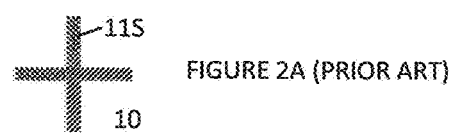
FIGS. 2A-2D are schematic views illustrating prior art alignment marks.
Figure 2B:
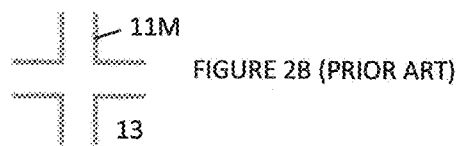
Figure 2C:
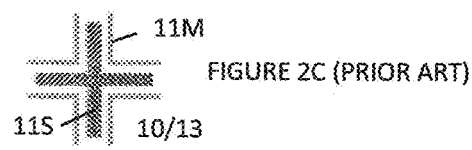
Figure 2D:
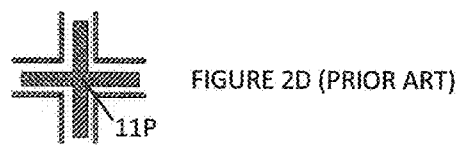
Figure 5:
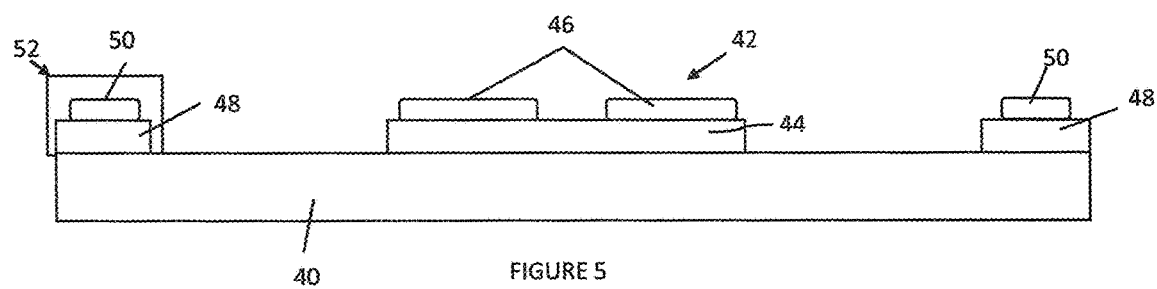
FIG. 5 is a schematic cross sectional view of a step in a method for transferring alignment marks between substrate systems of providing a substrate having semiconductor devices and alignment marks.

Referring to FIG. 5, a first step in a method for transferring alignment marks between substrate systems is illustrated. The first step comprises providing a substrate 40 having a plurality of semiconductor devices 42 and a plurality of alignment marks 48 formed thereon. In the illustrative embodiment, the substrate 40 comprises a semiconductor substrate having epitaxial structures 44 that form the semiconductor devices 42. For illustrative purposes the semiconductor devices 42 can also include metal contacts 46 that are co-planar to the surfaces of the alignment marks 48. Alternately, the substrate 40 can comprise a carrier substrate for holding the semiconductor devices 42.

The alignment marks 48 can comprise portions of the epitaxial structures 44 or a deposited material 50, or as shown in FIG. 5, a combination thereof. In an illustrative embodiment, the alignment marks 48 are formed during fabrication of the semiconductor devices 42 out of the same epitaxial structures 44 using semiconductor fabrication techniques. This allows precise fab shop alignment of the semiconductor devices 42 and the alignment marks 48 to one another or to other features on the substrate 40. In addition, the alignment marks 48 are physical structures that can be transferred between different substrate systems using different bonding techniques, such as adhesive bonding. Still further, the alignment marks 48 can also be configured as a sticker 52 (FIG. 5), or similar structure, which can be placed on and bonded to the substrate 40 after fabrication of the semiconductor devices 44.

Figure 6:
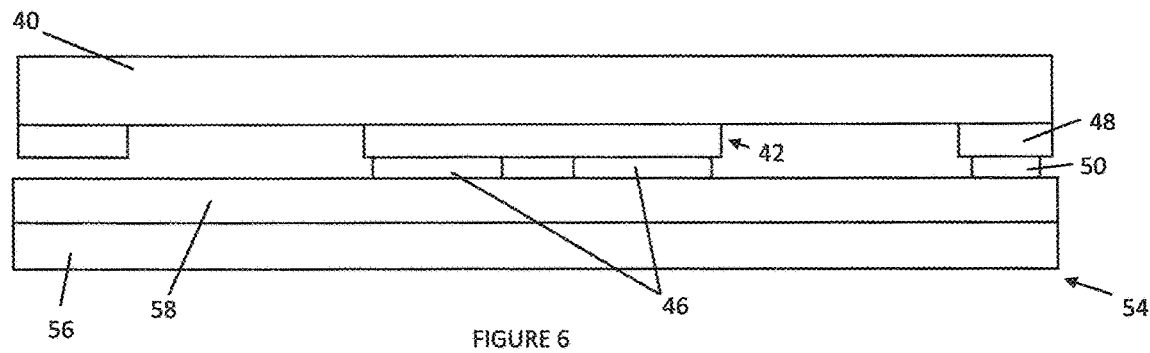
FIG. 6 is a schematic cross sectional view of a step in the method of placing the substrate proximate to a first substrate system having a temporary substrate.

Referring to FIG. 6, the method also includes the step of placing the substrate 40 proximate to a first substrate system 54. In an illustrative embodiment, the first substrate system 54 includes a temporary substrate 56 and an adhesive layer 58 for making temporary adhesive connections with the semiconductor devices 42 and with the alignment marks 48.

Figure 7:
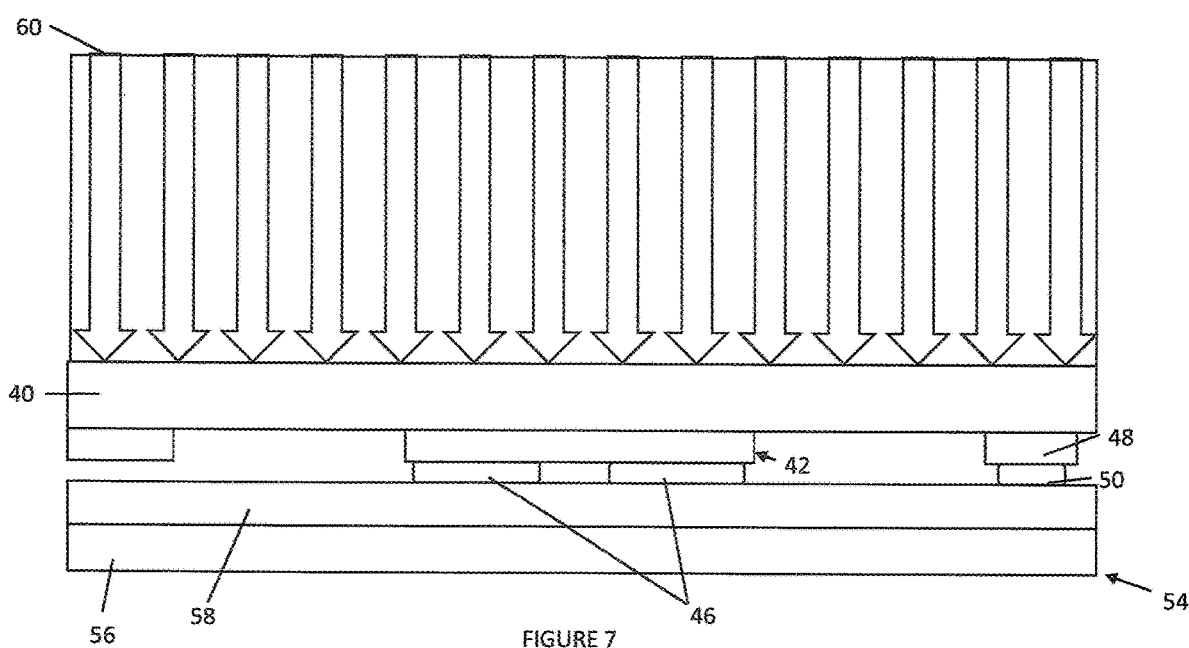
FIG. 7 is a schematic cross sectional view of a step in the method of bonding the semiconductor devices and the alignment marks to the temporary substrate of the first substrate system.

Referring to FIG. 7, the method also includes the step of physically transferring the semiconductor devices 42 and the alignment marks 48 from the substrate and bonding to the first substrate system 54. The transferring and bonding step can be performed using an energy system 60 that uses an energy such as thermal energy, optical energy, mechanical energy, electrical energy, or adhesive energy to bond the semiconductor devices 42 and the alignment marks 48 to the temporary substrate 56 of the first substrate system 54. In an illustrative embodiment, the adhesive layer 58 on the temporary substrate 56 facilitates bonding of the semiconductor devices 42 and alignment marks 48 using adhesive forces.

Referring to FIG. 8, the method also includes the step of separating the substrate 40 from the first substrate system 54 leaving the semiconductor devices 42 and the alignment marks 48 on the temporary substrate 56 while maintaining the precise alignment. The separating step can be performed during or separate from the bonding step using a lift-off method such as a thermal method, an optical method, a mechanical method, an electrical method, or an adhesive method. In an illustrative embodiment, the adhesive layer 58 on the temporary substrate 56 facilitates the separating step by applying adhesive forces to the semiconductor devices 42 and the alignment marks 48.

Figure 12:
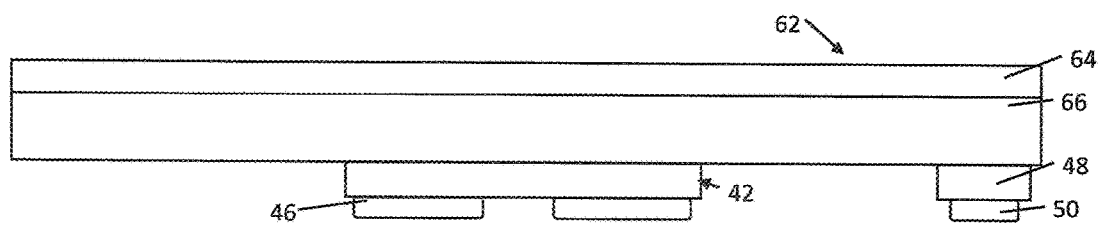

Referring to FIGS. 9-12, further steps in the method are illustrated wherein the semiconductor devices 42 and the alignment marks 48 are physically transferred from the first substrate system 54 and bonded to a second substrate system 62 in the form of a mass transfer system. As shown in FIG. 9, the second substrate system 62 includes a mass transfer substrate 64 having an adhesive layer 66 thereon. As shown in FIG. 10, the second substrate system 62 is placed proximate to the first substrate system 54 with the semiconductor devices in physical contact with the adhesive layer 66 on the mass transfer substrate 64. As shown in FIG. 11, the first substrate system 54 and the second substrate system 62 are separated, with the semiconductor devices 42 and the alignment marks 48 transferring to the mass transfer substrate 64. This separating step can be performed using a lift off process such as a thermal method, an optical method, a mechanical method, an electrical method, or an adhesive method. FIG. 12 illustrates the semiconductor devices 42 on the mass transfer substrate 64 of the second substrate system 62 ready for mass transfer as required for other fabrication or packaging processes.

Figure 13:
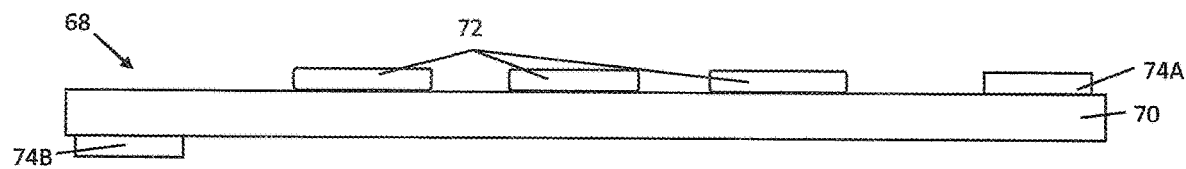
FIGS. 13-17 are schematic cross sectional views of further steps in the method wherein the semiconductor devices and alignment marks on the mass transfer substrate are transferred to a third substrate system having a circuitry substrate.
Figure 14:
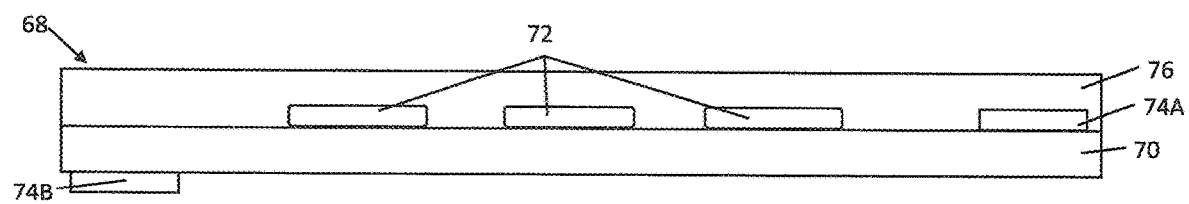

Referring to FIGS. 13-17, further steps in the method are illustrated wherein the semiconductor devices 42 and the alignment marks 48 are physically transferred from the second substrate system 62 and bonded to a third substrate system 68. As shown in FIG. 13, the third substrate system 68 includes a circuitry substrate 70 (e.g., PCB, MCPCB, or other circuitry related elements) having a plurality of circuits 72 and a plurality of front side circuitry alignment marks 74A and back side circuitry alignment marks 74B on either side of the circuitry substrate 70 in alignment with the circuits 72. As shown in FIG. 14, the method can further include the step of depositing a deposited material 76 on the circuits 72 and on the circuitry alignment marks 74A. Depending on the application, exemplary materials for the deposited material 76 include metals, adhesives, and insulators.

Figure 15:
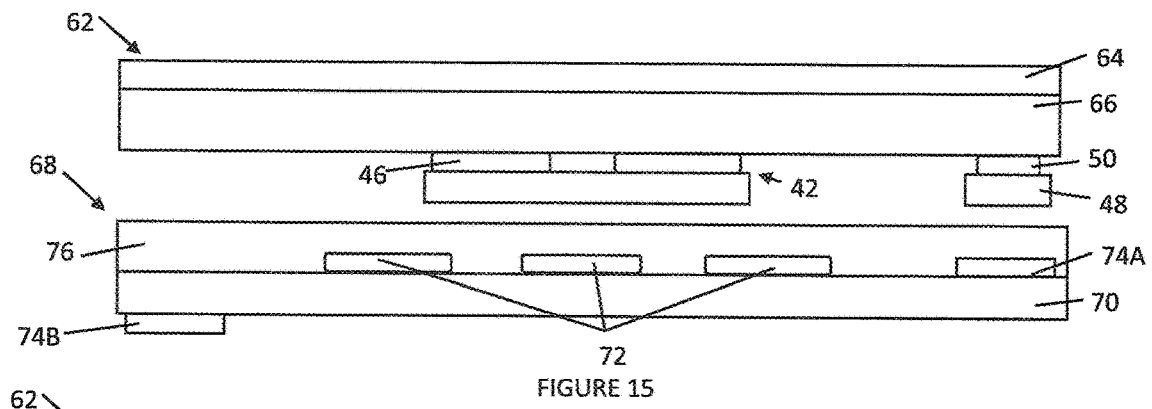
Figure 16:
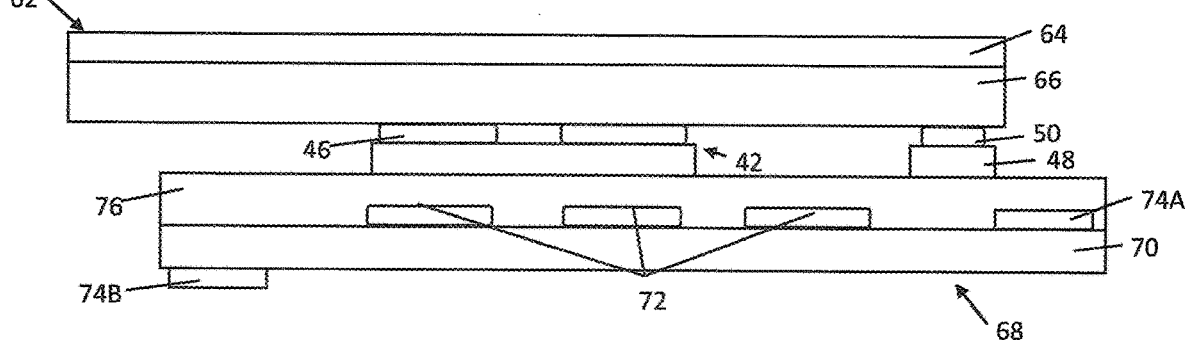
Figure 17:
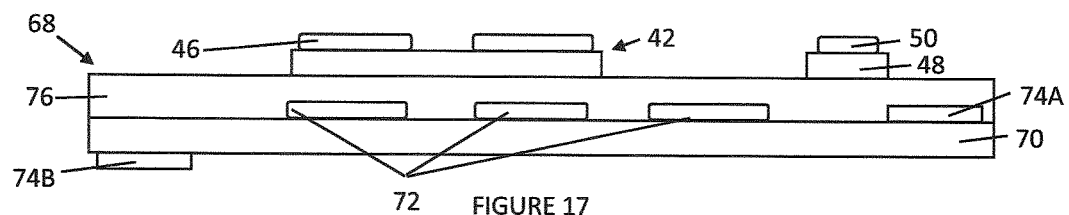

As shown in FIG. 15, the method can further include the step of aligning the mass transfer substrate 64 of the second substrate system 62 with the circuitry substrate 70 of the third substrate system 68 using the alignment marks 48 on the mass transfer substrate 64 and the circuitry alignment marks 74A on the circuitry substrate 70. As shown in FIG. 16, the method can further include the step of placing the mass transfer substrate 64 of the second substrate system 62 in physical contact with the circuitry substrate 70 of the third substrate system 68. As shown in FIG. 17, the method can further include the step of transferring the alignment marks 48 from the mass transfer substrate 64 to the circuitry substrate 70 and bonding alignment marks 48 to the circuitry substrate 70, and the step of separating the mass transfer substrate 64 leaving the circuitry substrate 70 with the alignment marks 48 and the circuitry alignment marks 74A, 74B thereon.

Figure 18:
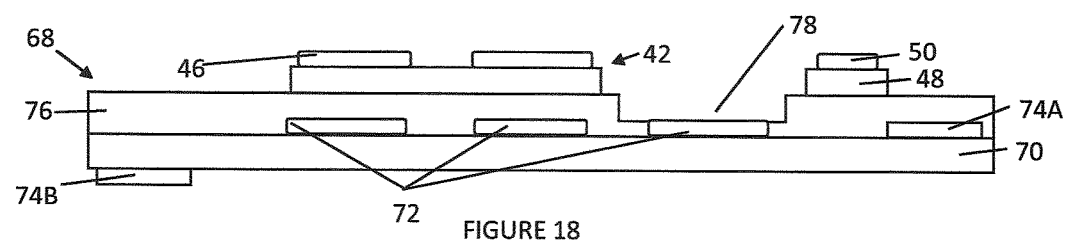
FIGS. 18-19 are schematic cross sectional views of further steps in the method wherein the third substrate system is further processed by etching and depositing of conductors in electrical communication with the semiconductor devices.
Figure 19:
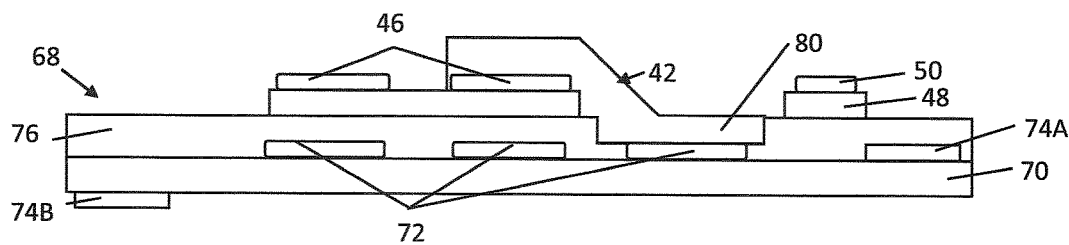

Referring to FIGS. 18-19, further steps in the method wherein the third substrate system 68 is further processed using semiconductor fabrication processes are illustrated. In FIG. 18, openings 78 are etched in the deposited material 76 that covers the circuits 72 on the circuitry substrate 70. In FIG. 19, conductors 80 are formed in the openings 78 in electrical communication with the contacts 46 on the semiconductor devices 42 and with the circuits 72 on the circuitry substrate 70. During these fabrication processes, the transferred alignment marks 48 on the circuitry substrate 70 maintain the precise alignment with the semiconductor devices 42 formed during the initial stages of the method.

Figure 20:
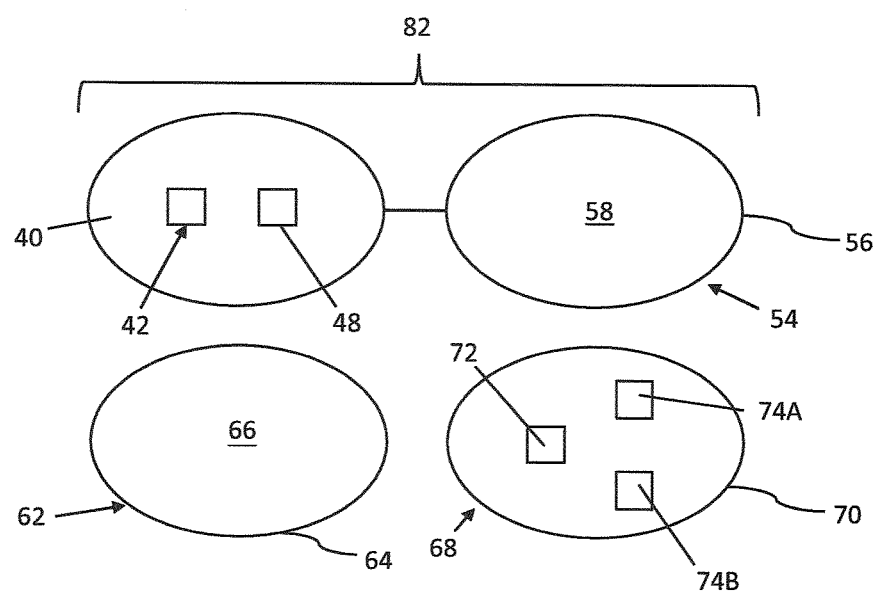
FIG. 20 is a schematic cross sectional view of a system for transferring alignment marks between substrate systems.

Referring to FIG. 20, a system 82 for transferring alignment marks between substrate systems includes the substrate 40 comprising the semiconductor devices 42 and the alignment marks 48 in precise alignment with the semiconductor devices 42. As previously explained, the alignment marks 48 comprise physical structures that can be physically transferred between substrate systems. The system 82 also includes a first substrate system 54 comprising the temporary substrate 56 having the adhesive layer 58. As previously explained, the temporary substrate 56 is configured to support and bond with the semiconductor devices 42 and the alignment marks 48 while maintaining the precise alignment between the semiconductor devices 42 and the alignment marks 48.

The system 82 can also include the second substrate system 62 comprising the mass transfer substrate 64 having the adhesive layer 66 thereon. The mass transfer substrate 64 is configured to support and bond with the semiconductor devices 42 and the alignment marks 48 while maintaining the precise alignment between the semiconductor devices 42 and the alignment marks 48. The system 82 can also include a third substrate system 68 comprising the circuitry substrate 70 having the circuits 72 and the circuitry alignment marks 74A, 74B in alignment with the circuits 72.

In general, the method and system are insensitive to the type of substrate be it opaque or transparent. In addition, the method and system are cheaper than repeating lithography several times since the same alignment marks formed during the frontend process are used in the backend processes. The method and system also facilitate usage in backend processes that require extremely high precision such as stamping, pick and placement, and precision bonding.

While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

We claim:

1. A method for transferring alignment marks between substrate systems comprising:
   providing a substrate comprising a plurality of semiconductor devices and a plurality of alignment marks in precise alignment;
   providing a first substrate system comprising a temporary substrate;
   physically transferring and bonding the semiconductor devices and the alignment marks to the temporary substrate of the first substrate system while maintaining the precise alignment between the semiconductor devices and the alignment marks; and
   separating the substrate from the first substrate system leaving the semiconductor devices and alignment marks on the temporary substrate while maintaining the precise alignment between the semiconductor devices and the alignment marks.

2. The method of claim 1 further comprising providing a second substrate system and physically transferring and bonding the semiconductor devices and the alignment marks to the second substrate system while maintaining the precise alignment between the semiconductor devices and the alignment marks.

3. The method of claim 2 further comprising providing a third substrate system, and physically transferring and bonding the semiconductor devices and the alignment marks to the third substrate system while maintaining the precise alignment between the semiconductor devices and the alignment marks.

4. The method of claim 1 wherein the substrate comprises a semiconductor substrate having epitaxial structures that form the semiconductor devices and the alignment marks.

5. The method of claim 1 wherein the substrate comprises a carrier substrate configured for holding the semiconductor devices.

6. The method of claim 1 wherein the alignment marks comprise portions of an epitaxial structure, a deposited material, or a combination thereof formed on the substrate as physical transferrable structures.

7. The method of claim 1 wherein the transferring and bonding step is performed using thermal energy, optical energy, mechanical energy, electrical energy, adhesive energy or combinations thereof.

8. A method for transferring alignment marks between substrate systems comprising:
   providing a substrate comprising a plurality of semiconductor devices and a plurality of alignment marks in precise alignment, the alignment marks comprising transferrable physical structures;
   providing a first substrate system comprising a temporary substrate;
   physically transferring and bonding the semiconductor devices and the alignment marks to the temporary substrate of the first substrate system while maintaining the precise alignment between the semiconductor devices and the alignment marks;
   separating the substrate from the first substrate system leaving the semiconductor devices and alignment marks on the temporary substrate while maintaining the precise alignment between the semiconductor devices and the alignment marks;
   providing a second substrate system comprising a mass transfer substrate; and
   physically transferring and bonding the semiconductor devices and the alignment marks to the second substrate system while maintaining the precise alignment between the semiconductor devices and the alignment marks.

9. The method of claim 8 further comprising providing a third substrate system comprising a circuitry substrate and circuits on the circuitry substrate, and physically transferring the semiconductor devices and the alignment marks from the mass transfer substrate and bonding to the circuitry substrate while maintaining the precise alignment between the semiconductor devices and the alignment marks.

10. The method of claim 9 further comprising separating the mass transfer substrate of the second substrate system leaving the circuitry substrate and the semiconductor devices on the circuitry substrate.

11. The method of claim 10 further comprising further processing the semiconductor devices on the third substrate system using at least one semiconductor fabrication process.

12. The method of claim 11 wherein the semiconductor fabrication process comprises forming of conductors in electrical communication with the semiconductor devices.

13. The method of claim 12 wherein the substrate comprises a semiconductor substrate having epitaxial structures that form the semiconductor devices and the alignment marks.

* * * * *